United States Patent
Krishnamoorthy et al.

(10) Patent No.: US 7,619,312 B2
(45) Date of Patent: Nov. 17, 2009

(54) METHOD AND APPARATUS FOR PRECISELY ALIGNING INTEGRATED CIRCUIT CHIPS

(75) Inventors: Ashok V. Krishnamoorthy, San Diego, CA (US); John E. Cunningham, San Diego, CA (US); Edward Lee Follmer, Del Mar, CA (US)

(73) Assignee: Sun Microsystems, Inc., Santa Clara, CA (US)

( * ) Notice: Subject to any disclaimer, the term of this patent is extended or adjusted under 35 U.S.C. 154(b) by 124 days.

(21) Appl. No.: 11/243,300

(22) Filed: Oct. 3, 2005

(65) Prior Publication Data
US 2008/0018000 A1    Jan. 24, 2008

(51) Int. Cl.
*H01L 23/48*     (2006.01)
*H01L 23/52*     (2006.01)
*H01L 29/40*     (2006.01)
*H01L 23/544*    (2006.01)
*H01L 23/02*     (2006.01)
*H01L 31/00*     (2006.01)
*H01L 21/00*     (2006.01)
*H01L 21/66*     (2006.01)

(52) U.S. Cl. .................. 257/777; 257/782; 257/797; 257/E23.01; 257/685; 257/24; 257/E21.499; 257/E21.511; 438/462; 438/108; 438/15; 438/26; 438/51; 438/55; 438/64; 438/106; 438/124; 438/126; 438/127

(58) Field of Classification Search .............. 257/678, 257/723, 731, 734, 780, 777, 778, 738, 797, 257/E23.001, E23.003, E23.004, E23.005, 257/E23.01, E23.021, E23.179, 676, 680, 257/686, 782, 685, 24, E21.499–E21.519; 439/73, 67; 385/14, 32, 33, 93; 438/462, 438/108, 15, 26, 51, 55, 64, 106, 124–127
See application file for complete search history.

(56) References Cited

U.S. PATENT DOCUMENTS

| | | | | | |
|---|---|---|---|---|---|
| 4,894,706 | A | * | 1/1990 | Sato et al. | 361/770 |
| 5,118,027 | A | * | 6/1992 | Braun et al. | 228/180.22 |
| 5,123,073 | A | * | 6/1992 | Pimpinella | 385/59 |
| 5,124,281 | A | * | 6/1992 | Ackerman et al. | 438/27 |
| 5,219,117 | A | * | 6/1993 | Lin | 228/253 |
| 5,319,725 | A | * | 6/1994 | Buchmann et al. | 385/14 |
| 5,479,703 | A | * | 1/1996 | Desai et al. | 29/852 |
| 5,574,561 | A | * | 11/1996 | Boudreau et al. | 356/399 |
| 5,783,870 | A | * | 7/1998 | Mostafazadeh et al. | 257/791 |
| 5,964,397 | A | * | 10/1999 | Dautartas | 228/180.22 |
| 6,236,115 | B1 | * | 5/2001 | Gaynes et al. | 257/774 |

(Continued)

*Primary Examiner*—Steven Loke
*Assistant Examiner*—Arman Khosraviani
(74) *Attorney, Agent, or Firm*—Park, Vaughan & Fleming LLP

(57) ABSTRACT

A system that facilitates precise inter-chip alignment. The system includes a first integrated circuit chip, whose surface has etch pit wells. The system also includes a second integrated circuit chip, whose surface has corresponding etch pit wells that mate with the etch pit wells of the first integrated circuit chip. Spherical balls are placed in the etch pit wells of the first integrated circuit chip such that when the corresponding etch pit wells of the second integrated circuit chip are substantially aligned with the spherical balls, the spherical balls mate with the etch well pits of the second integrated circuit chip, thereby precisely aligning the first integrated circuit chip with the second integrated circuit chip.

7 Claims, 5 Drawing Sheets

U.S. PATENT DOCUMENTS

| | | | |
|---|---|---|---|
| 6,443,631 B1* | 9/2002 | Case et al. | 385/91 |
| 6,512,861 B2* | 1/2003 | Chakravorty et al. | 385/14 |
| 6,526,205 B1* | 2/2003 | Wilson et al. | 385/52 |
| 6,546,172 B2* | 4/2003 | Case et al. | 385/52 |
| 6,546,173 B2* | 4/2003 | Case et al. | 385/52 |
| 6,701,038 B2* | 3/2004 | Rensing et al. | 385/18 |
| 6,907,150 B2* | 6/2005 | Steinberg et al. | 385/14 |
| 6,965,166 B2* | 11/2005 | Hikita et al. | 257/777 |
| 6,971,164 B2* | 12/2005 | Case et al. | 29/840 |
| 6,973,253 B2* | 12/2005 | Steinberg et al. | 385/140 |
| 6,986,609 B2* | 1/2006 | Kim et al. | 385/88 |
| 7,010,855 B2* | 3/2006 | Case et al. | 29/832 |
| 7,065,283 B2* | 6/2006 | Steinberg et al. | 385/137 |
| 7,183,633 B2* | 2/2007 | Daneman et al. | 257/678 |
| 7,233,723 B2* | 6/2007 | Williams et al. | 385/33 |
| 2001/0007372 A1* | 7/2001 | Akram et al. | 257/724 |
| 2001/0035576 A1* | 11/2001 | Wachtler et al. | 257/697 |
| 2001/0036344 A1* | 11/2001 | Steinberg et al. | 385/92 |
| 2003/0205799 A1* | 11/2003 | Yunus | 257/684 |
| 2004/0105611 A1* | 6/2004 | Bischel et al. | 385/14 |
| 2004/0228600 A1* | 11/2004 | Steinberg et al. | 385/137 |
| 2005/0104176 A1* | 5/2005 | Rodney et al. | 257/678 |
| 2005/0111797 A1* | 5/2005 | Sherrer et al. | 385/93 |
| 2005/0185900 A1* | 8/2005 | Farr | 385/93 |
| 2005/0269699 A1* | 12/2005 | Haw et al. | 257/737 |
| 2006/0006486 A1* | 1/2006 | Seo et al. | 257/433 |
| 2006/0023998 A1* | 2/2006 | Williams et al. | 385/33 |
| 2006/0228916 A1* | 10/2006 | Sato et al. | 439/73 |

* cited by examiner

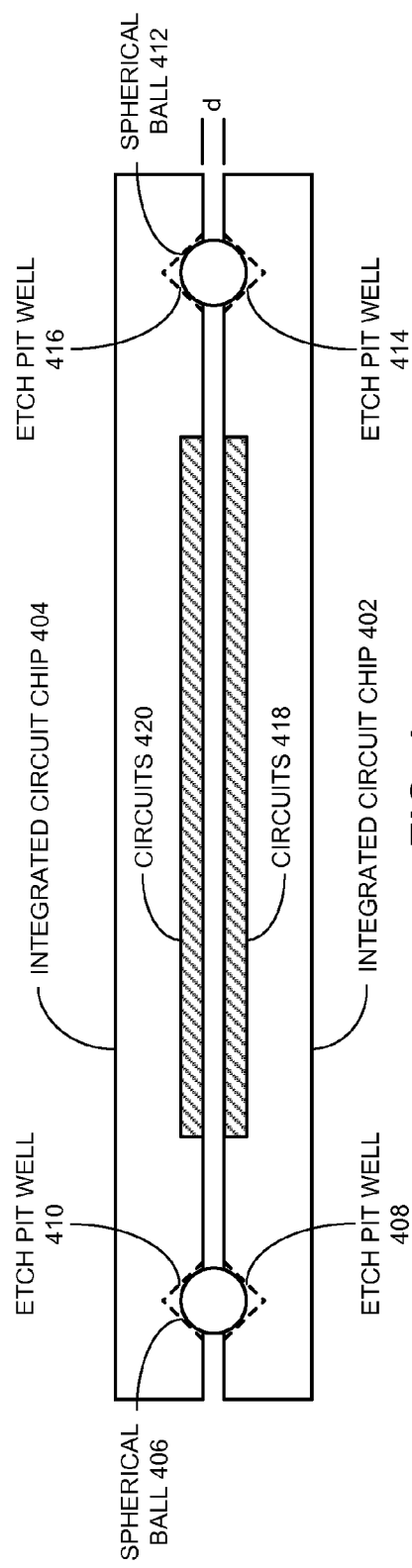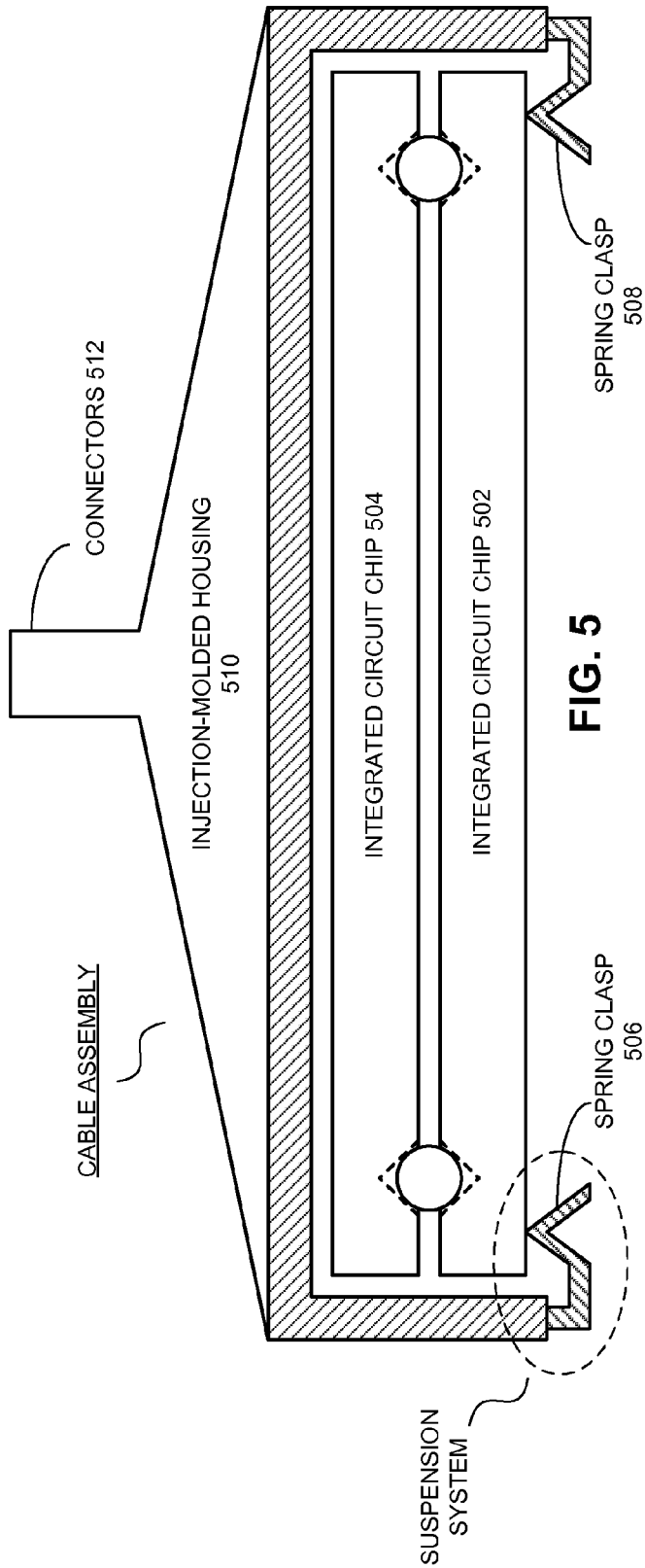

US 7,619,312 B2

METHOD AND APPARATUS FOR PRECISELY ALIGNING INTEGRATED CIRCUIT CHIPS

GOVERNMENT LICENSE RIGHTS

This invention was made with United States Government support under Contract No. NBCH020055 awarded by the Defense Advanced Research Projects Administration. The United States Government has certain rights in the invention.

BACKGROUND

1. Field of the Invention

The present invention relates to a technique for precisely aligning integrated circuit chips or wafers.

2. Related Art

Advances in semiconductor technology presently make it possible to integrate large-scale systems, including tens of millions of transistors, onto a single semiconductor chip. Integrating such large-scale systems onto a single semiconductor chip increases the speed at which such systems can operate, because signals between system components do not have to cross chip boundaries, and are not subject to lengthy chip-to-chip propagation delays. Moreover, integrating large-scale systems onto a single semiconductor chip significantly reduces production costs, because fewer semiconductor chips are required to perform a given computational task.

However, these semiconductor chips still need to communicate with other chips, and unfortunately, these advances in semiconductor technology have not been matched by corresponding advances in inter-chip communication technology. Semiconductor chips are typically integrated into a printed circuit board which contains multiple layers of signal lines for inter-chip communication. However, a semiconductor chip typically contains about 100 times to 1000 times more signal lines than a printed circuit board. Consequently, only a tiny fraction of the signal lines on a semiconductor chip can be routed across the printed circuit board to other chips. This problem is creating a bottleneck that is expected to worsen as semiconductor integration densities continue to increase.

To overcome this communication bottleneck, researchers have recently developed an alternative technique, known as "Proximity Communication," to communicate between semiconductor chips. Proximity Communication can be implemented by integrating arrays of capacitive transmitters and receivers onto active surfaces of integrated circuit (IC) chips to facilitate inter-chip communication. If a first chip is situated face-to-face with a second chip so that transmitter regions on the first chip are capacitively coupled with receiver regions on the second chip, it is possible to transmit signals directly from the first chip to the second chip without having to route the signal through intervening signal lines within a printed circuit board. The advantage of such an arrangement is that a large number of electronic terminals on one chip can each communicate with corresponding electronic terminals on the other chip.

Proximity Communication makes it possible to communicate with an extremely large bandwidth per unit area. For example, in an exemplary implementation, the size and center-to-center pitch of Proximity Communication terminals can be 20 microns and 30 microns, respectively. Moreover, under Proximity Communication, signals travel in the direction normal to the surface of the chip. Therefore, Proximity Communication allows communication to take place across a fully populated two-dimensional array of terminals, with many rows and many columns.

For comparison purposes, the size and pitch of a typical wire bond terminal may be 100 microns on a side with a pitch of 150 microns from the center of one terminal to the neighboring terminal. Furthermore, wire bonds are typically limited to a few rows. Hence, wire bonds generally cannot be used to provide a large fully populated two-dimensional array of terminals.

Proximity Communication provides off-chip signaling bandwidth that can scale with the feature size and with the on-chip frequency. However, precise alignment constraints must be satisfied for Proximity Communication to operate effectively. FIG. 2 illustrates a top-view of two integrated circuit chips where the receiver pads on one integrated circuit chip are misaligned with the transmitter pads on the other integrated circuit chip. To effectively utilize the large bandwidth available through Proximity Communication, the receiver pads must be aligned with the transmitter pads as illustrated in FIG. 1. Hence, an alignment mechanism which can precisely align the integrated circuit chips is needed.

As continuing advances in integrated circuit technology make it possible to create denser and faster circuits, there is a need for even greater precision alignment between the two integrated circuit chips. This need continues to grow as the integrated circuits become increasingly more sophisticated and continue to increase in density.

SUMMARY

One embodiment of the present invention provides a system that facilitates precise inter-chip alignment. The system includes a first integrated circuit chip, whose surface has etch pit wells. The system also includes a second integrated circuit chip, whose surface has corresponding etch pit wells that mate with the etch pit wells of the first integrated circuit chip. Spherical balls are placed in the etch pit wells of the first integrated circuit chip such that when the corresponding etch pit wells of the second integrated circuit chip are substantially aligned with the spherical balls, the spherical balls mate with the etch well pits of the second integrated circuit chip, thereby precisely aligning the first integrated circuit chip with the second integrated circuit chip.

In a variation on this embodiment, the spherical balls are perfectly spherical sapphire balls and the equators of the spherical balls are higher than the chip surface. In this variation, the vertical alignment between the first integrated circuit chip and the second integrated circuit chip can be precisely set by adjusting the depth of the etch pit well, the feature size of the etch pit well, and the diameter of the spherical ball, thereby facilitating precise three-dimensional alignment of the integrated circuit chips.

In a variation on this embodiment, the etch pit wells are fabricated by etching a 100-silicon surface, which creates an etch pit well with precise angles due to the crystallographic properties of 100-silicon. Note that a timed-etch is not required to precisely set the distance between the first integrated circuit chip and the second integrated circuit chip.

In a variation on this embodiment, three spherical balls are used to precisely align the first integrated circuit chip with the second integrated circuit chip. A fourth spherical ball can be used to provide mechanical stability. Note that additional substantially spherical balls can be used.

In a variation on this embodiment, a first etch pit well on the first integrated circuit chip aligns with the corresponding first etch pit well on the second integrated circuit chip, thereby providing a primary positional reference. A second etch pit well on the first integrated circuit chip aligns with the corresponding second etch pit well on the second integrated circuit chip, thereby providing a rotational reference. Note that the combination of the first etch pit well and the second etch pit well fixes the horizontal alignment of the integrated circuit chips. A third and a fourth etch pit well fix the spacing between the integrated circuit chips. Note that the third and the fourth etch pit wells can be larger than the first and second etch pit wells, thereby relaxing the tolerances on the dimensions of the etch pit wells.

In a variation on this embodiment, the spherical balls are conductive and facilitate distribution of power between the first integrated circuit chip and the second integrated circuit chip.

In a variation on this embodiment, the first integrated circuit chip partially overlaps a second integrated circuit chip.

In a variation on this embodiment, the system further comprises a connector, which includes a housing that provides strain relief from external mechanical forces. The housing includes the second integrated circuit chip, which is coupled to the housing, but is not permanently attached to the housing; a spring clasp, which holds the first integrated circuit chip to the second integrated circuit chip, and which releases to allow detachment of the first integrated circuit chip from the second integrated circuit chip; and tapered guides, which provide coarse alignment of the first integrated circuit chip to the second integrated circuit chip.

In a variation on this embodiment, the system further includes a circuit board assembly, which houses the first integrated circuit chip and a cable assembly, which facilitates communication between circuit board assemblies. The cable assembly includes: (1) a housing, which contains the second integrated circuit chip, wherein the second integrated circuit chip is not permanently attached to the housing; (2) a suspension system, which facilitates mating the cable assembly to the circuit board assembly, which provides compliance during connector mating and alignment, and which provides a controlled preload force to hold the first integrated circuit chip and the second integrated circuit chip together at a pre-specified distance; and (3) a protective cover, which disengages during mating.

In a variation on this embodiment, the cable assembly further includes: (1) a guiding mechanism which guides the cable assembly to substantially align with the fixed chip; (2) a camming mechanism, which prevents the first integrated circuit chip from making contact with the second integrated circuit chip until the chips are properly aligned; and (3) a locking mechanism, which reduces the effect of external mechanical strain on the alignment of the first integrated circuit chip with respect to the second integrated circuit chip.

In a variation on this embodiment, a plurality of integrated circuit chips are aligned with the first integrated circuit chip using the substantially spherical balls located on the first integrated circuit chip.

In a variation on this embodiment, the aligned integrated circuit chips are configured in a linear chain or in a two-dimensional array.

BRIEF DESCRIPTION OF THE FIGURES

FIG. 4 illustrates two integrated circuit chips which are aligned using etch pit wells and spherical balls in accordance with an embodiment of the present invention.

FIG. 5 illustrates a connector in accordance with an embodiment of the present invention.

DETAILED DESCRIPTION

The following description is presented to enable any person skilled in the art to make and use the invention, and is provided in the context of a particular application and its requirements. Various modifications to the disclosed embodiments will be readily apparent to those skilled in the art, and the general principles defined herein may be applied to other embodiments and applications without departing from the spirit and scope of the present invention. Thus, the present invention is not limited to the embodiments shown, but is to be accorded the widest scope consistent with the principles and features disclosed herein.

Alignment of Integrated Circuit Chips

The present invention relates to a structure and a technique for aligning and interconnecting two integrated circuit chips with improved accuracy. Note that such integrated circuit chips that use Proximity Communication to communicate with each other require precision alignment not only laterally but also in axially (in other words, z-direction or height). In the past, chips have been die bonded onto PCB boards with lateral manufacturing accuracies of approximately 50 microns. Also, in typical die bonding manufacturing practices, the topographical height of the integrated circuit chips above the PCB cannot be controlled.

The spacing between two circuits that are flip-chip bonded is controlled by the topology of metal bumps, which are about 40 microns in diameter and which leave a gap of several tens of microns. The collapse of the metal bumps and the final chip separation in these approaches are not well controlled. Additionally, when the chips are connected by the above techniques, they cannot be disconnected. The present invention overcomes these drawbacks by providing a connector that is precision-aligned both laterally and in relative height, and can be disconnected and reconnected. Note that remateability enables failed chip replacement at low cost.

Figure 1:
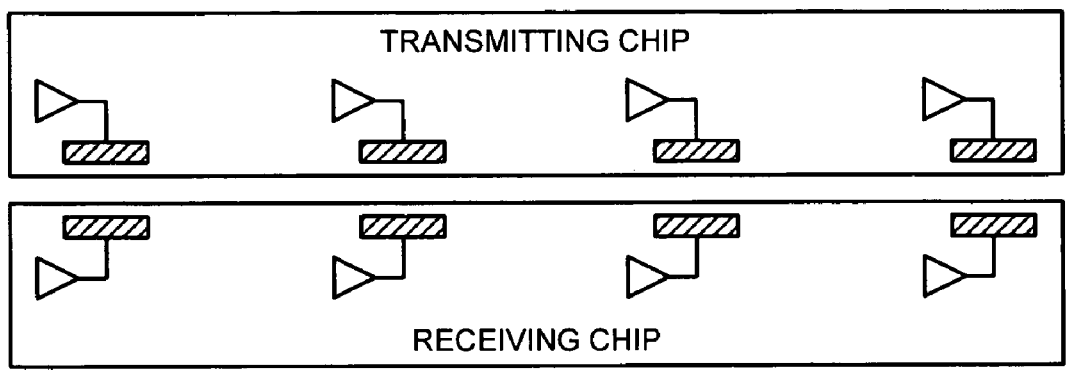
FIG. 1 illustrates aligned receiver pads overlapping with transmitter pads.
Figure 2:
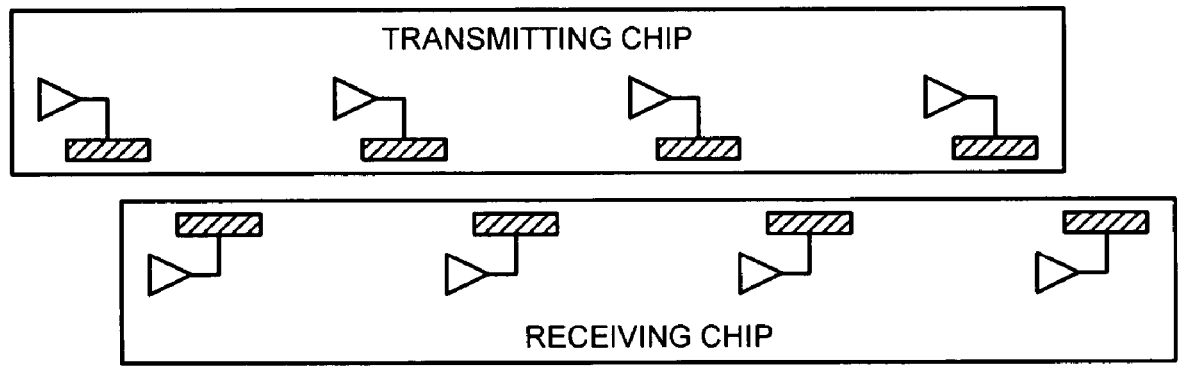
FIG. 2 illustrates misaligned receiver pads overlapping with transmitter pads.
Figure 3:
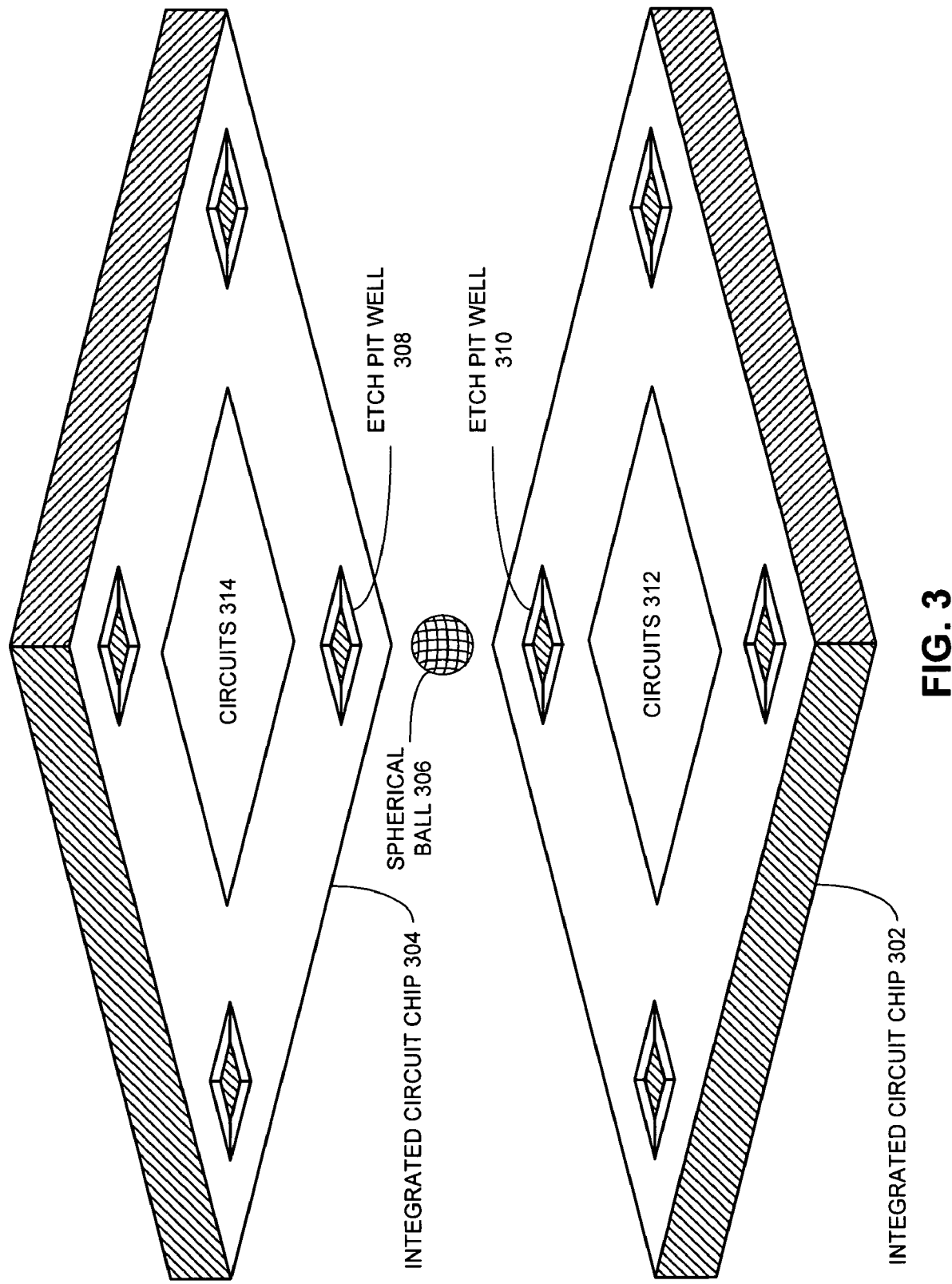
FIG. 3 illustrates two integrated circuit chips which use etch pit wells for alignment in accordance with an embodiment of the present invention.

FIG. 3 illustrates two integrated circuit chips which use etch pit wells for alignment in accordance with an embodiment of the present invention. It contains integrated circuits 302 and 304, spherical ball 306, etch pit wells 308 and 310, and circuits 312 and 314. In one embodiment of the present invention, the spherical balls are sapphire spherical balls. In FIG. 3, integrated circuit chips 302 and 304 contain circuits 312 and 314 that are positioned face-to-face. A set of etch pit wells are fabricated at the corners of integrated circuit chips 302 and 304. These etch pit wells capture precision spherical balls that are inserted into the wells before the positioning step. For example, in FIG. 3, etch pit wells 308 and 310 capture spherical ball 306.

Integrated circuit chips 302 and 304 are then brought in mechanical alignment. As the joining process continues, the spherical balls eventually co-locate the two integrated circuit chips as the balls equilibrate into each corner of the chips. FIG. 4 illustrates the equilibrium settling of both chips. At equilibrium, circuit 420 on integrated circuit chip 404 precisely aligns to circuit 418 on integrated circuit chip 402.

FIG. 4 illustrates two integrated circuit chips which are aligned using etch pit wells and spherical balls in accordance with an embodiment of the present invention. It contains integrated circuit chips 402 and 404, etch pit wells 408, 410, 416, and 414, spherical balls 406 and 412, and circuits 418 and 420.

Integrated circuit chips 402 and 404 contain electrical circuits that are positioned face-to-face. A set of etch pit wells are fabricated into the corners of each integrated circuit. These etch pit wells 408, 410, 414, and 416 capture precision spherical balls that are inserted into the wells and hold the two integrated circuit chips in precise mechanical alignment.

FIG. 4 illustrates a condition where both top and bottom chips have full (100%) overlap. In another embodiment of the present invention, integrated circuit chips 402 and 404 are only partially overlapping, either at chip corners, or along one or more sides of a chip, but are still aligned with respect to each other using the techniques described herein.

One aspect of the present invention is the silicon etch pit wells. These etch pit wells are manufactured photolithographically before, during, or after circuit fabrication on the silicon chips. This technique allows the etch pits to be photolithographically defined in relationship to the circuits located on the integrated circuit chips. The photolithographic alignment between the etch pit wells and the circuits therefore ensures that the integrated circuit chips are also precisely aligned to each other.

The lateral alignment between the circuits for top and bottom chips in FIG. 4 is achieved if spherical balls 406 and 412 are sufficiently large to fit in etch pit wells 408, 410, 414, and 416. Note that a spherical ball that is too small cannot align integrated circuit chip 402 with integrated circuit chip 404. However, if spherical balls 406 and 412 sit in the etch pit wells such that their equators are higher than the chip surface, then integrated circuit chips 402 and 404 are precisely aligned.

In one embodiment of the present invention, the distance between integrated circuit chips 402 and 404 can be adjusted. Both integrated circuit chips have an exact separation, d, with a value that is dependent only on three input parameters: the photolithographic feature size of the etch pit well, the etch depth of the etch pit well, and the spherical ball diameter. In general the separation between chips, d, can range from less than 1 micron to over 100 microns.

Since integrated circuit chip 402 has four balls, one in each corner, a well-defined plane is created in which the spacing between circuits is uniformly established over extended lateral distances of the chip. This is an important issue since most mating connectors have significant slop resulting in misalignment tilts of several degrees. For chips of side length 1 cm such misalignments can equate to of 100 microns of variation. The uniformity of chip misalignment is approximately 0.03 microns. Note that only three spherical balls are needed to form a plane. Four spherical balls provide improved mechanical stability.

In one embodiment of the present invention, the spherical balls are conductive. If many spherical balls are used, then power and ground can uniformly be distributed and shared between the integrated circuit chips.

Note that when etching a 100 silicon surface, the angle of the etch pit well is set by the 111 planes. This angle is exactly 54.7 degrees. For example, the depth proceeds with an etch that removes all planes but the 111 planes. This etch is dictated by local silicon chemistry between solute and silicon. Eventually, as the etch proceeds through a defined opening in a 100 surface, four 111 facets are exposed. Note that the etching process does not attack 111 planes. The bottom of the wells may become less perfect since the reactions may become mass-transport limited. However, these imperfections do not impact the present invention since the vertex of the etch pit well does not support the spherical balls.

Additionally, note that the chip separation, d, only depends on the photolithography definition of the etch pit well and the diameter of the spherical balls. Therefore, timed etches, stop-etch layers, and knowledge of the exact depth of the etch pit well are not required. Furthermore, note that other orientations and other shapes may be used, such as truncated spheres, prisms, and hexagons.

In one embodiment of the present invention, a plurality of integrated circuit chips are aligned with the first integrated circuit chip using the substantially spherical balls located on the first integrated circuit chip.

In one embodiment of the present invention, the aligned integrated circuit chips are configured in a linear chain or in a two-dimensional array.

Embodiments of the present invention include a first integrated circuit chip whose surface has four or more etch pit wells and a second integrated circuit chip whose surface has four or more corresponding etch pit wells that mate with the etch pit wells of the first integrated circuit chip. In these embodiments, substantially spherical balls are placed in the etch pit wells of the first integrated circuit chip such that when the corresponding etch pit wells of the second integrated circuit chip are substantially aligned with the substantially spherical balls, the substantially spherical balls mate with the etch well pits of the second integrated circuit chip, thereby precisely aligning the first integrated circuit chip with the second integrated circuit chip. In embodiments of the present invention, a predetermined number of the four or more etch pit wells are larger than the other pit wells and each larger etch pit well on the first integrated circuit chip aligns with a corresponding larger etch pit well on the second integrated circuit chip, thereby relaxing the tolerances on the dimensions of the etch pit wells.

Connector

FIG. 5 illustrates a connector in accordance with an embodiment of the present invention. It contains integrated circuit chips 502 and 504, spring clasps 506 and 508, injection-molded housing 510 and connectors 512. Note that integrated circuit chips 502 and 504 have full (100%) overlap. In another embodiment of the present invention, integrated circuit chips 502 and 504 are partially overlapping, but still aligned with respect to each other using the techniques described herein. Injection-molded housing 510 provides a low-insertion force connector to secure the alignment of the two integrated circuit chips.

Details of a connector for one embodiment of the present invention are shown in FIG. 5. This embodiment shows both silicon chips that have been precision aligned with spherical balls in etch pith wells and a housing to provide a low insertion force coupling. The basic mechanical functionality of the housing is to initially provide coarse chip alignment and to retain the two integrated circuit chips after completing precision alignment. Note that the etch wells are tapered to guide the integrated circuit chips into precision alignment after coarse alignment occurs. The connector also contains interconnects to the integrated circuit chips that are packaged in the housing.

In one embodiment of the present invention, the inter-chip alignment is achieved by the spherical balls and etch pit wells, and is independent of the injection-modeled housing. The housing primarily provides a spring-loaded actuation that keeps both chips held together.

The principal of operation for the connector is as follows. Integrated circuit chip 502 (note that support structure is not shown) has spherical balls permanently attached into etch pit wells. For example, the spherical balls can be attached to integrated circuit chip 502 using epoxy. Integrated circuit chip 504 is coupled to the connector. Tapered guides in the housing (not shown) provide course alignment of the two chips. Spring clasps 506 and 508, which are not part of the alignment mechanism, accurately hold the integrated circuit chips together. The clasps can then open to allow the integrated circuit chips to detach. This embodiment relies solely on the etch wells and spheres for alignment. In one embodiment of the present invention, parts of the housing are designed to establish coarse alignment.

When integrated into the connector, the integrated circuit chips are not attached to the housing, and therefore are not constrained by the housing. Nevertheless, the housing provides the necessary tension to eliminate chip separation except when intentionally disconnecting the connector from integrated circuit chip 502.

Note that precision alignment at sub-micron resolution is performed entirely as a passive alignment step. Also note that because the present invention uses wafer scale processing and low cost components, it can uses low cost packaging. The cost of the connector assembly is further reduced because it does not require active alignment. Also note that the precision alignment is housing independent and therefore can use very low cost injection molded parts.

Connecting to Circuit Board Assemblies

One embodiment of the present invention relates to a precision chip-to-chip connector assembly providing high-speed electrical input and output signals. This embodiment is driven by the simultaneous need for precision nested alignment, environmental protection between two electronic chips, and high-speed electrical input/output. One of these integrated circuit chips is part of a rigid circuit board assembly incorporating built in precision alignment features described above. The other integrated circuit chip is part of a connector assembly that facilitates communication between circuit board assemblies. The connector assembly incorporates similar precision alignment features and a housing that provides environmental protection to prevent damage and contamination during handling.

In one embodiment of the present invention, the housing of the connector assembly is made from low-cost reinforced injection-molded plastic. In this embodiment, the cable end of the connector assembly is composed of several parts. One component is a base component that houses the integrated circuit chip and a floating suspension system for the chip structure with a mating interconnect cable. The spring loaded suspension system for the electronic chip provides compliance during connector mating and alignment. It also provides a controlled preload force to assure that the two integrated circuit chips maintain contact at the precisely controlled proximity during operation. The other component is a protective cover which disengages during connector mating. The housing also provides necessary strain relief for the cable end, so that no external mechanical influences can affect the alignment of the two chips.

Figure 6:
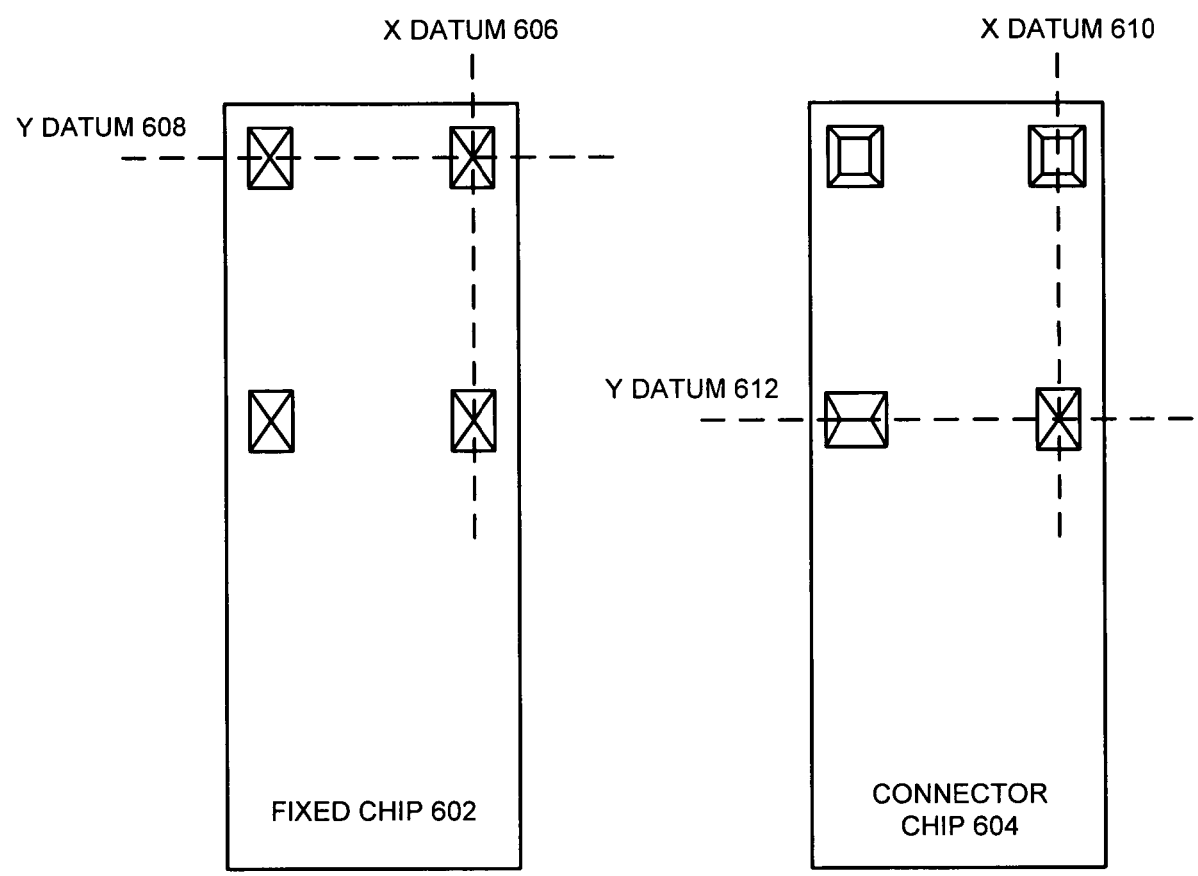
FIG. 6 illustrates an arrangement of etch pit wells used to align a fixed chip with a connector chip in accordance with an embodiment of the present invention.

FIG. 6 illustrates an arrangement of etch pit wells used to align a fixed chip with a connector chip in accordance with an embodiment of the present invention. It contains fixed chip 602, connector chip 604, x datums 606 and 610, y datums 608 and 612.

The spherical balls are assembled in the etch wells of the fixed chip, creating a reference datum system controlling location, rotation, and height of the mating connector chip. When the connector chip is brought into approximate alignment during the mating of the connector housings, the spherical ball located at the x datum 606 and y datum 608 of fixed chip 602 locates itself in the etch pit well located at x datum 610 and y datum 612 on connector chip 604. This mating provides the primary position reference. A second spherical ball on y datum 608 of fixed chip 602 locates itself in the slot created on y datum 612 of connector chip 604, thus establishing the rotational reference. (Note that there is some allowance for true position of the ball.) The remaining two spherical balls on fixed chip then find the slightly larger wells, and provide the final spacing reference between the two integrated circuit chips. A true position analysis based on the capabilities of the accuracy of the silicon etch process and the planarity of the Silicon wafers can be done to determine the optimal size and location of the larger wells.

Note that this alignment technique allows for a relaxation in tolerances for fabrication of the true position and orientation of the etch pit wells, as well as some relaxation in the positional tolerance requirements for the assembly of the aforementioned spherical balls, while still maintaining overall location and spacing requirements.

Compliant Suspension System

One embodiment of the present invention provides a compliant suspension system that supports the connector chip, which is designed to provide some freedom of motion to allow the connector chip to accurately mate with the fixed chip. Note that the final resting orientation is determined solely by the orientation of the precision spherical balls. Also note that the suspension system provides a preload force which maintains the proper spacing between integrated circuit chips once they are mated. Furthermore, note that the suspension system provides some protection for the chip in the event there is gross misalignment during the mating of connectors. The suspension system will "give" to prevent an interference fit, which may result in damage to both chips.

Figure 7A:
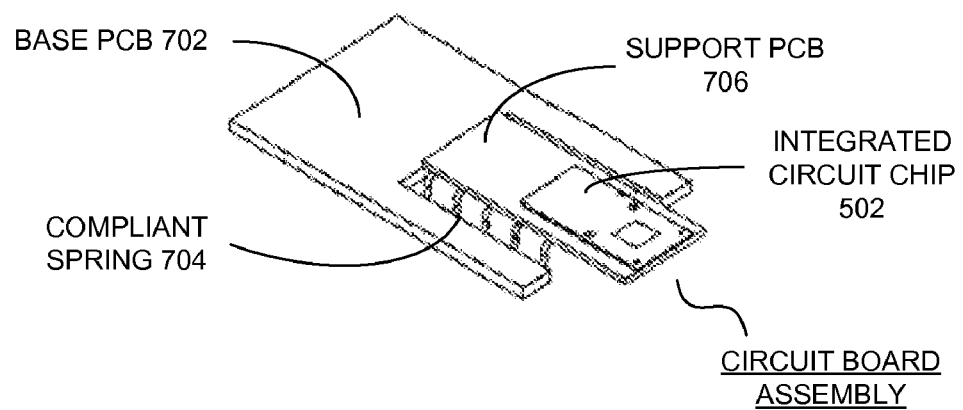
FIG. 7A illustrates a compliant suspension system in accordance with an embodiment of the present invention.

FIG. 7A illustrates a compliant suspension system in accordance with an embodiment of the present invention. It contains base PBC 702, complaint spring 704, support PCB 706 and integrated circuit chip 502. Shifts or tugs at base PCB 702 are effectively shielded by compliant spring 704 from integrated circuit chip 502.

Figure 7B:
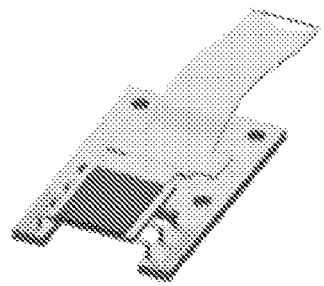
FIG. 7B illustrates another compliant suspension system in accordance with an embodiment of the present invention.

FIG. 7B illustrates another compliant suspension system in accordance with an embodiment of the present invention. It is an extension of the suspension system illustrated in FIG. 7A and transmits high-speed electrical signals via a flexible cable between the base PCB that interfaces to the external environment and the support PCB that houses the Proximity chip.

Figure 7C:
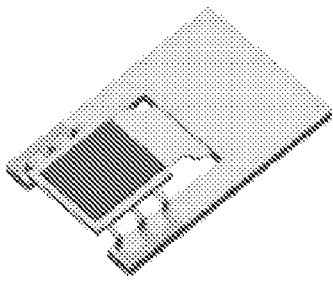
FIG. 7C illustrates yet another compliant suspension system in accordance with an embodiment of the present invention.

FIG. 7C illustrates yet another compliant suspension system in accordance with an embodiment of the present invention. The high-bandwidth flex cable depicted in FIG. 7B is embedded within the layers of the base PCB and support PCB, respectively. This embodiment is beneficial because it is conducive to simpler, more cost-effective manufacturing.

Yet another embodiment of the inventive principles taught herein relates to the mating, retention, and alignment features incorporated into the molded body of the connector shells. As the cable end of the connector half is mated with the fixed half, a guiding mechanism guides the two connector halves into approximate alignment, within a range where the precision alignment of the sapphire spherical balls integrated with the etch pit wells create the final alignment. A camming mechanism ensures that the two chips will not come into inadvertent contact with each other until they are properly nested together during insertion. Once they have been properly nested and aligned, a locking mechanism provides mechanical strain relief to mitigate any external mechanical influences from affecting the alignment of the two integrated circuit chips.

In one embodiment of the present invention, a protective mechanism in the housing of the cable connector protects the delicate integrated circuit chips from damage due to mishandling or environmental effects. This protective mechanism can be retracted during mating of the two halves of the connector.

The foregoing descriptions of embodiments of the present invention have been presented only for purposes of illustration and description. They are not intended to be exhaustive or to limit the present invention to the forms disclosed. Accordingly, many modifications and variations will be apparent to practitioners skilled in the art. Additionally, the above disclosure is not intended to limit the present invention. The scope of the present invention is defined by the appended claims.

What is claimed is:

1. An apparatus that facilitates precise inter-chip alignment, comprising:
   a first integrated circuit chip, whose surface has four etch pit wells;
   a connector, which includes a housing that provides strain relief from external mechanical forces, wherein the housing includes:
      a second integrated circuit chip coupled to the housing but not permanently attached to the housing, wherein a surface of the second integrated circuit chip has four corresponding etch pit wells that mate with the etch pit wells of the first integrated circuit chip;
      a spring clasp, which holds the first integrated circuit chip to the second integrated circuit chip, and which releases to allow detachment of the first integrated circuit chip from the second integrated circuit chip; and
      tapered guides, which provide coarse alignment of the first integrated circuit chip to the second integrated circuit chip; and
   substantially spherical balls, which are placed in the etch pit wells of the first integrated circuit chip such that when the corresponding etch pit wells of the second integrated circuit chip are substantially aligned with the substantially spherical balls, the substantially spherical balls mate with the etch well pits of the second integrated circuit chip, thereby precisely aligning the first integrated circuit chip with the second integrated circuit chip;
   wherein a predetermined number of the etch pit wells on the first integrated circuit chip are larger than the other pit wells on the first integrated circuit chip and wherein each larger etch pit well on the first integrated circuit chip aligns with a corresponding etch pit well on the second integrated circuit chip, thereby relaxing the tolerances on the dimensions of the etch pit wells.

2. The apparatus of claim 1,
   wherein the substantially spherical balls are perfectly spherical sapphire balls; and
   wherein the equator of the perfectly spherical sapphire balls are higher than the chip surface; and
   wherein the vertical alignment between the first integrated circuit chip and the second integrated circuit chip can be precisely set by adjusting the depth of the etch pit well on the first integrated circuit chip and the second integrated circuit chip, the feature size of the etch pit well on the first integrated circuit chip and the second integrated circuit chip, and the diameter of the perfectly spherical sapphire balls, thereby facilitating precise three-dimensional alignment of the integrated circuit chips.

3. The apparatus of claim 2,
   wherein the etch pit well on the first integrated circuit chip and the second integrated circuit chip are fabricated by etching a 100-silicon surface, which creates an etch pit well with precise angles due to the crystallographic properties of 100-silicon; and
   wherein a timed-etch is not required to precisely set the distance between the first integrated circuit chip and the second integrated circuit chip.

4. The apparatus of claim 1,
   wherein a first etch pit well on the first integrated circuit chip aligns with the corresponding first etch pit well on the second integrated circuit chip, thereby providing a primary positional reference;
   wherein a second etch pit well on the first integrated circuit chip aligns with the corresponding second etch pit well on the second integrated circuit chip, thereby providing a rotational reference;
   wherein the combination of the first etch pit well and the second etch pit well fixes the horizontal alignment of the integrated circuit chips;
   wherein a third and a fourth etch pit well on the first integrated circuit chip and a third and a fourth etch pit well on the second integrated circuit chip fix the spacing between the integrated circuit chips and wherein the third and fourth etch pit wells on the first integrated circuit chip align with the corresponding third and fourth etch pit wells on the second integrated circuit chip; and
   wherein the third and the fourth etch pit wells on the first integrated circuit chip are larger than the first and second etch pit wells on the first integrated circuit chip, thereby relaxing the tolerances on the dimensions of the etch pit wells.

5. The apparatus of claim 1, wherein the substantially spherical balls are conductive and facilitate distribution of power between the first integrated circuit chip and the second integrated circuit chip.

6. The apparatus of claim 1, wherein the first integrated circuit chip partially overlaps a second integrated circuit chip.

7. A computer apparatus that facilitates precise inter-chip alignment, comprising:
   a first integrated circuit chip, whose surface has four etch pit wells;
   a connector, which includes a housing that provides strain relief from external mechanical forces, wherein the housing includes:
      a second integrated circuit chip coupled to the housing but not permanently attached to the housing, wherein a surface of the second integrated circuit chip has four corresponding etch pit wells that mate with the etch pit wells of the first integrated circuit chip;
      a spring clasp, which holds the first integrated circuit chip to the second integrated circuit chip, and which releases to allow detachment of the first integrated circuit chip from the second integrated circuit chip; and tapered guides, which provide coarse alignment of the first integrated circuit chip to the second integrated circuit chip; and substantially spherical balls, which are placed in the etch pit wells of the first integrated circuit chip such that when the corresponding etch pit wells of the second integrated circuit chip are substantially aligned with the substantially spherical balls, the substantially spherical balls mate with the etch well pits of the second integrated circuit chip, thereby precisely aligning the first integrated circuit chip with the second integrated circuit chip;

wherein a predetermined number of the etch pit wells on the first integrated circuit chip are larger than the other pit wells on the first integrated circuit chip and wherein each larger etch pit well on the first integrated circuit chip aligns with a corresponding etch pit well on the second integrated circuit chip, thereby relaxing the tolerances on the dimensions of the etch pit wells.

\* \* \* \* \*

UNITED STATES PATENT AND TRADEMARK OFFICE
CERTIFICATE OF CORRECTION

PATENT NO. : 7,619,312 B2 Page 1 of 1
APPLICATION NO. : 11/243300
DATED : November 17, 2009
INVENTOR(S) : Krishnamoorthy et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 154 days.

Signed and Sealed this

Twenty-sixth Day of October, 2010

David J. Kappos
*Director of the United States Patent and Trademark Office*